United States Patent [19]
Wakefield

[11] Patent Number: 5,561,594
[45] Date of Patent: Oct. 1, 1996

[54] CIRCUIT CONNECTION IN AN ELECTRICAL ASSEMBLY

[75] Inventor: Elwyn P. M. Wakefield, Bristol, England

[73] Assignee: SGS-Thomson Microelectronics Ltd., Bristol, England

[21] Appl. No.: 371,802

[22] Filed: Jan. 11, 1995

[30] Foreign Application Priority Data

Jan. 11, 1994 [GB] United Kingdom ............... 9400384

[51] Int. Cl.⁶ .................. H05K 7/02; H01R 9/00; H01R 43/04
[52] U.S. Cl. .................. 361/760; 439/66; 439/74; 439/84; 437/212; 29/844; 29/882; 361/772; 361/773
[58] Field of Search ................ 439/91, 591, 66–67, 439/74–75, 80–84; 257/723–724; 361/760–764, 784–791, 772–773; 174/52.4; 437/212; 29/838, 844, 861, 863, 882

[56] References Cited

U.S. PATENT DOCUMENTS

| | | |
|---|---|---|
| 4,373,778 | 2/1983 | Adham . |
| 4,433,886 | 2/1984 | Cassarly et al. . |
| 4,508,405 | 4/1985 | Damon et al. . |
| 5,102,352 | 4/1992 | Arisaka ................... 439/608 |
| 5,399,982 | 3/1995 | Driller et al. ............ 324/754 |

FOREIGN PATENT DOCUMENTS

| | | | |
|---|---|---|---|
| 0525651A1 | 2/1993 | European Pat. Off. | H01L 21/60 |
| 1-235261 | 9/1989 | Japan | H01L 23/28 |
| 3-268440 | 11/1991 | Japan | H01L 21/60 |
| WO84/02631 | 7/1984 | WIPO | H05K 1/14 |

Primary Examiner—Bot L. Ledynh
Attorney, Agent, or Firm—David V. Carlson; Harry K. Ahn; Seed and Berry LLP

[57] ABSTRACT

An electrical assembly comprises an electrical component having an array of contact bumps. The component is mounted on a multilayer printed circuit board having a plurality of conducting pins located in holes in the board and having pointed ends projecting above the board and making electrical contact with the bumps on the component.

22 Claims, 2 Drawing Sheets

CIRCUIT CONNECTION IN AN ELECTRICAL ASSEMBLY

The invention relates to circuit connection in an electrical assembly and particularly to making electrical contact with an array of connection points on an electrical component. The component may comprise a semiconductor chip or it may comprise a modular package including one or more semiconductor chips.

BACKGROUND OF THE INVENTION

Problems arise in making electrical connection to electronic semiconductor devices having a plurality of connection pins. Modern semiconductor chips and packages frequently have a high pin count as well as a requirement for low inductance in the electrical connections that are made to the pins. Semiconductor chips and packages have commonly been provided with a plurality of peripheral projecting conducting tabs to which external circuitry has been connected by soldering. Such projecting tabs have increased the path length and thereby inductance of the connections and this has led to extensive use of chips or packages in which the external contact points are provided by projecting bumps of soft conducting material. Such devices are already known as bumped grid arrays and include solder grid arrays, ball grid arrays and bumped chips. Such conducting bumps usually comprise a plurality of rows forming an array on one or more faces of the chip or package and are not formed as peripheral extensions of the package. When using such chips or packages on a printed circuit board it is impractical to make interconnections between two bumps across the face of the device as conductors would need to be routed around neighbouring bumps. Usually the connections will be made through conductors on a printed circuit board so that the interconnection is routed through conductors at one or more layers on the printed circuit board and thereby avoiding obstructions. Problems can arise in using reflow solder to connect such chips or packages onto a circuit board. The elevated temperatures used may damage the components or cause mechanical stresses to be induced that may cause premature system failure. Furthermore some components may need to be replaced.

It is an object of the present invention to provide an improved connection in an electrical assembly avoiding the use of reflow solder.

SUMMARY OF THE INVENTION

The present invention provides an electrical assembly comprising an electrical component having a planar support on which is mounted electrical circuitry and an array of electrical contact points connected to said circuitry, and an electrical connecting device contacting said contact points, which electrical connecting device comprises an insulating planar support member on which is mounted an array of rigid electrically conducting pins projecting from a face of said planar support member, at least some of said pins engaging a respective contact point on said electrical component, and a retainer holding said electrical component pressed against said conducting pins.

Preferably said electrical connecting device comprises a printed circuit board.

Said electrical component may comprise one or more silicon chips. The invention is particularly applicable when said electrical contact points comprise a bumped grid array.

Preferably each contact point comprises a projecting bump of soft conducting material.

In some applications said electrical component includes an insulating cover layer extending over said array of contact points, the cover layer being formed of soft plastics material penetrable by pressure against said pins.

Said electrical connecting device may comprise an insulating board with a network of conducting elements extending in the plane of said support member at different levels within said support member, said pins being arranged to make electrical contact with respective said conducting elements.

Preferably each of said pins has a pointed end to engage a said contact point.

The invention also provides a circuit board comprising an insulating support board with a network of conducting elements extending in the plane of the support board at different levels within said support board, an array of rigid conducting pins being located in respective holes formed in said support board so that the pins make electrical contact with respective conducting elements in the support board, each of said pins having an end projecting from a face of the support board so as to engage a respective contact point of a grid array of contacts on an electrical component when positioned on said circuit board.

Said pins may be arranged to form projections on both sides of said circuit board.

The invention also provides a method of effecting electrical connection between an electrical component and a circuit board having a network of conducting elements extending in the plane of an insulating support board at different levels within the support board, which method comprises forming a plurality of holes through the board to provide access to respective said conducting elements, inserting a projecting pin of rigid conducting material into each hole to contact the respective conducting element and provide a contact end projecting from the hole above the surface of the board, mounting an electrical component with an array of contact points face to face on said circuit board and holding the electrical component pressed against the circuit board with selected contact points on said electrical component engaging respective pins on said circuit board.

BRIEF DESCRIPTION OF THE DRAWINGS

FIG. 1 shows a known construction of a semiconductor package 11 incorporating one or more semiconductor chips and having on a face thereof an array of projecting bumps 18 forming an array of contact points. Each of the bumps 18 consists of a projecting bump of soft conducting metal connected to an internal component in the semiconductor chip and insulated from each other on the surface of the device 11. The tips of the bumps 18 are substantially coplanar.

Figure 1:
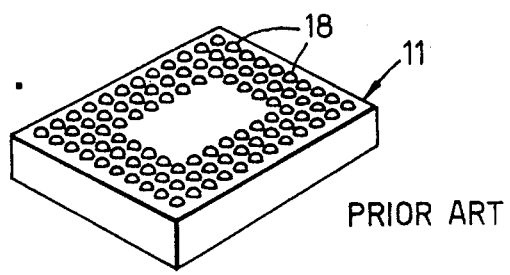
FIG. 1 shows a bump array component incorporating a semiconductor chip.
Figure 2:
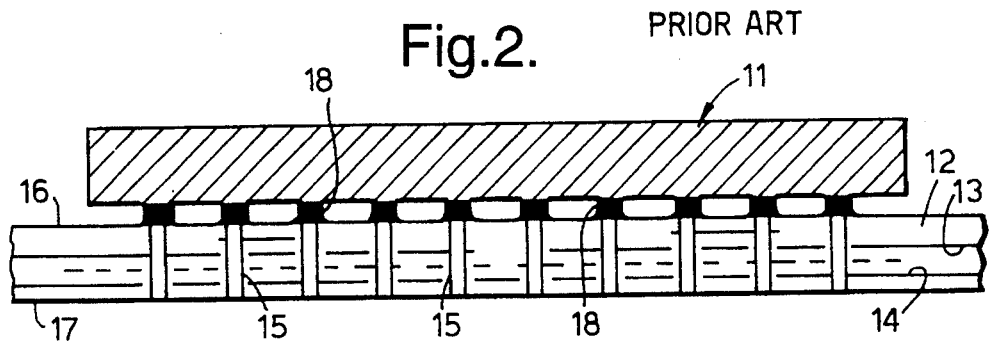
FIG. 2 is a section through a device of the type shown in FIG. 1 mounted on a printed circuit board in accordance with the prior art technique.

To mount such a device on a printed circuit board in accordance with one known technique the device may be soldered in the manner shown in FIG. 2. The device 11 is mounted on the multilayer printed circuit board 12 which is a copper/epoxy laminate forming a rigid planar support having conducting elements 13 and 14 extending through the planar support 12 at different depths within the support. A plurality of holes 15 are drilled through the board 12 from its upper face 16 to its lower face 17 and the interiors of the holes are copper plated to form a conductive bridge where required between conducting layers in the printed circuit board. In this prior art arrangement the device 11 is placed face to face with the board 12 with the array of bumps 18 located above required holes 15 in the printed circuit board and by application of heat the bumps 18 are reflowed to make a solder connection between the bump 18 and the upper end of the copper in the hole 15. Any slight variation in planar location of the bumps is accommodated by the flowing solder to ensure good electrical contact across the array.

Figure 3:
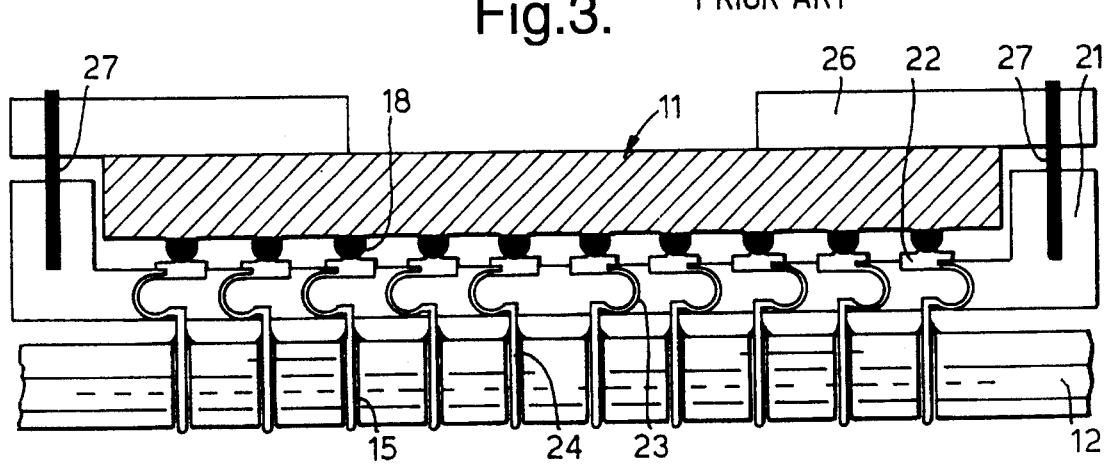
FIG. 3 shows a view similar to FIG. 2 showing an alternative prior art technique.

To avoid the problems of application of heat in soldering such devices together with the problems of removing and replacing devices as necessary, an alternative prior art proposal has involved the use of a socket of the type shown in FIG. 3. Similar reference numerals have been used for corresponding parts of FIG. 2 and 3. In this case a component support 21 is used to hold the device 11 on the printed circuit board 12. The component support 21 is formed with a plurality of contact pads 22 mounted on spring arms 23 having pins 24 located in the holes 15. The device 11 sits in the support 21 with the contact bumps 18 each engaging a respective contact pad 22 and urged against the spring 23 by means of a clamp 26 acting as a sprung lid to the support 21. The lid 26 has retaining members 27 to keep the device 11 pressed against the sprung mounted contact pads 22. This allows simple insertion and removal of the device 11 but the use of such sockets impairs electrical performance by significantly increasing the length and hence inductance of the interconnections used. Furthermore, the use of the socket designs can restrict the flow of heat away from the component when in use thereby causing reduction in operating speed and life expectancy of the component. The flexibility of the spring arms 23 ensures effective contact with bumps across the array.

DESCRIPTION OF THE PREFERRED EMBODIMENTS

Figure 4:
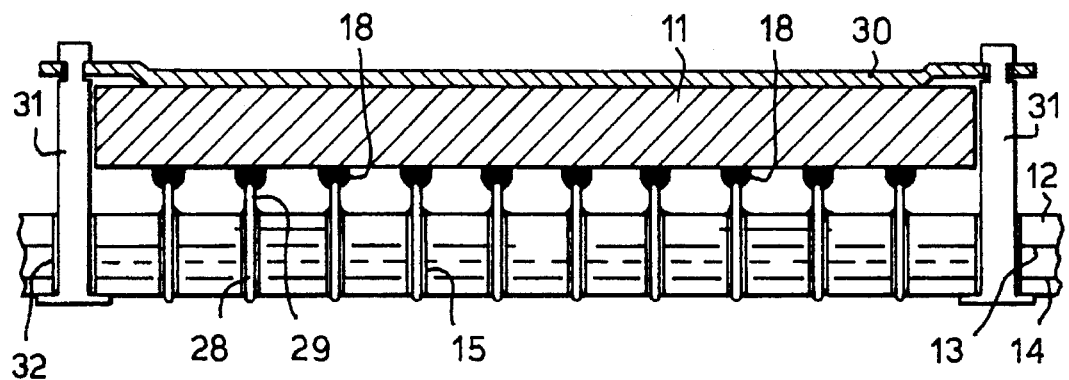
FIG. 4 is a view similar to FIG. 2 showing an arrangement in accordance with the present invention.

An embodiment in accordance with the invention is shown in FIG. 4 where again similar reference numerals have been used for similar parts. Again the device 11 is arranged face to face with the multilayer printed circuit board 12 with the array of contact bumps 18 aligned with required holes 15 which have been formed through the printed circuit board 12. In this example each of the holes 15 is fitted with a rigid conducting pin 28 having a pointed upper end 29 projecting above the upper surface of the board 12. Each of the pins 28 is secured in position in its respective hole 5 as shown in FIG. 4 so that the pin is not axially displaced by downwards pressure from the device 11. The pointed ends 29 of each of the pins 28 engages and forms an indentation in the respective soft contact bump 18 of the device 11. In this way good electrical contact is made with all bumps in the array. The device is held in position by a sprung lid 30 mounted on supports 31 projecting through holes 32 in the printed circuit board 12. The sprung lid 30 may be releasably attached to the supports 31 so that when necessary the lid can be removed and the device 11 simply lifted out of position. A new device can be inserted and refitted by reapplication of the spring lid 30. It will be seen that good electrical contact is made between the array of contact bumps 18 and the pins 28 in the printed circuit board thereby connecting the bumps to required linear conducting elements 13 or 14 in the printed circuit board. The connections are now short in length thereby avoiding unrequired inductance problems. The lid 30 may be formed from a thermally conductive material such as aluminum or beryllium/copper in order to remove unwanted heat from operation of the device 11. The sprung lid 30 may be arranged to cover a single component or it may be more extensive and arranged to cover a plurality of components extending over the whole of the circuit board area. A finned heat sink could be fixed in place of the lid in order to improve heat dissipation.

In the above examples the pins 28 have sufficient mechanical strength to be put under compression by the pressure contact with the bumps 18 without deformation or bending of the pins. The pins have hard pointed ends so that under the pressure contact by closure of the spring lid 30 they enter the soft or malleable material of the bumps 18. This allows for good electrical contact across the array of bumps and accommodates any slight variation in the planar location of the bump tips without the need for soldering or other heat treatment. Instead of using spring contacts to handle planar variation of the bump tip locations, each needle tip enters into the engaging soft bump contact to ensure good electrical contact. The pins 28 have body portions of sufficient diameter to provide the necessary strength and to fit holes of sufficient size that they can be readily drilled in the printed circuit board 12. The pins 28 can be held in the holes in the board 12 by press fitting, glued, soldered or otherwise fixed.

Figure 5:
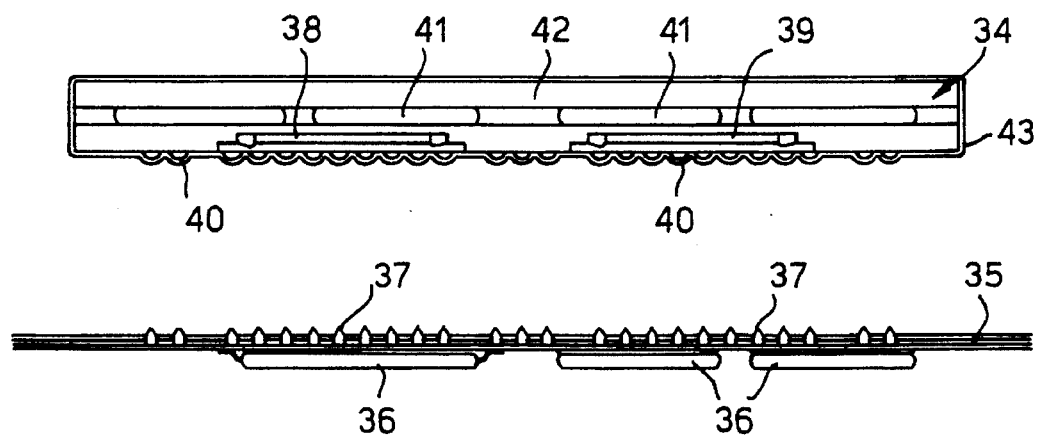
FIG. 5 is a section through an alternative assembly of a modular package and a printed circuit board prior to assembly in accordance with the present invention.

An alternative embodiment is shown in FIG. 5. In this case a printed circuit board 35 has attached to one face thereof a plurality of components 36 in conventional manner. On an upper face of the board 35 project a plurality of pointed ends of pin conductors 37 forming electrical contact with elongated conducting elements within the printed circuit board 35 similar to the arrangement already described in FIG. 4. However in this case the device 34 comprises a modular package incorporating two silicon chips 38 and 39 each having electrical connections to a bump grid array formed by bumps 40 on a lower face of the package. The array of projecting pins 37 in the printed circuit board are arranged to correspond to the array pattern of the bumps 40 so that appropriate electrical connections are made when the module 34 is mounted on the printed circuit board 35. The bumps 40 are similar to the bumps 18 of FIG. 4 and the pins 37 are similar to pins 28.

In addition to the silicon chips 38,39 this module includes other components 41 and a heat spreader 42. To protect the modular package when not mounted on the printed circuit board, the package is covered with an envelope of soft plastics insulating material such as silicone gel 43. This coating 43 normally insulates the array of bumps 40 but when pressed into position on the printed circuit board 35 and held against the board by a spring urged mounting arrangement such as that already described in FIG. 4, the projecting ends of pins 37 pierce the coating 43 of the module 34 and each make engagement with and good electrical contact with the soft metallic contact bumps 40 lying below the coating 43.

The invention is not limited to the details of the foregoing examples. Each device 11 may include a single chip or multiple chips. Each device 11 may have exposed contacts or be covered by an insulating soft coating such as that of FIG. 5. Further, the foregoing specific embodiments represent just some of the ways of practicing the present invention. Accordingly, the scope of the present invention is not limited to the foregoing specification, but instead is given by the appended claims along with their full range of equivalents.

I claim:

1. An electrical assembly comprising an electrical component having a planar support on which is mounted electrical circuitry and an array of deformable electrical contact points connected to said circuitry, and an electrical connecting device contacting said contact points, which electrical connecting device comprises an insulating planar support member on which is mounted an array of rigid electrically conducting pins projecting from a face of said planar support member, said pins having pointed ends and at least some of said pins engaging respective contact points on said electrical component, and a retainer holding said electrical component pressed against said conducting pins, to effect contact pressure with said respective contact points such that said pointed ends of said pins enter into said deformable contact points.

2. An assembly according to claim 1 in which said electrical connecting device comprises a printed circuit board.

3. An assembly according to claim 1 in which said electrical component comprises one or more semiconductor chips.

4. An assembly according to claim 1 in which said electrical contact points comprise a bumped grid array.

5. An assembly according to claim 1 in which each pin has a pointed end and each said contact point comprises a projecting bump of soft conducting material which is penetrated by an engaging pin.

6. An assembly according to claim 5 in which said electrical component includes an insulating cover layer extending over said array of contact points, the cover layer being formed of soft plastics material penetrable by pressure against said pins.

7. An assembly according to claim 1 in which said electrical connecting device comprises an insulating board with a network of conducting elements extending in the plane of said support member at different levels within said support member, said pins being arranged to make electrical contact with respective said conducting elements.

8. An assembly according to claim 1 in which said retainer is a releasable resilient clamping device.

9. A circuit board comprising an insulating support board with a network of conducting elements extending in the plane of the support board at different levels within said support board, an array of rigid conducting pins being located in respective holes formed in said support board so that the pins make electrical contact with respective conducting elements in the support board, each of said pins having a pointed end and projecting from a face of the support board such that when pressed against a respective deformable contact point of a grid array of contacts on an electrical component the pointed end of each pin enters into the respective deformable contact point.

10. A circuit board according to claim 9 wherein said pins are arranged to form projections on both sides of said circuit board.

11. A method of effecting electrical connection between an electrical component and a circuit board having a network of conducting elements extending in the plane of an insulating support board at different levels within the support board, which method comprises forming a plurality of holes through the board to provide access to respective said conducting elements, inserting a projecting pin of rigid conducting material into each hole to contact the respective conducting element and provide a pointed contact end projecting from the hole above the surface of the board, mounting an electrical component with an array of deformable contact points face to face on said circuit board and holding the electrical component pressed against the circuit board with selected contact points on said electrical component engaging respective pins on said circuit board, said pointed contact ends entering into respective deformable contact points.

12. An electrical connection assembly comprising:
   an insulating package having a lower surface and containing a plurality of electrical circuits;
   a plurality of malleable contact points connected to the electrical circuits and positioned on the lower surface of the insulating package; and
   an electrical connecting device including an insulating planar support member having an upper surface; and
   a plurality of rigid electrically conducting pins each having a pointed end and projecting from the upper surface of the insulating planar support member such that when pressed against the respective malleable contact points the pointed ends of the rigid pins enter into the respective malleable contact points.

13. The assembly according to claim 12 wherein the insulating planar support member is a printed circuit board.

14. The assembly according to claim 12 wherein the plurality of circuits include at least one semiconductor chip.

15. The assembly according to claim 12 wherein each malleable contact point comprises a projecting bump.

16. The assembly according to claim 12 wherein the insulating package further includes an insulating cover layer extending over the plurality of contact points, the cover layer being sufficiently soft to be penetrated by pressure applied against the rigid pins.

17. The assembly according to claim 12 wherein the insulating planar support member includes an insulating board; and
   a plurality of conducting elements extending in the plane of the insulating board at different levels within the insulating board, the rigid pins making electrical contact with the respective conducting elements.

18. The assembly according to claim 12, further comprising a releasable resilient clamping device pressing the rigid pins against the respective malleable contact points.

19. An electrical connection assembly comprising:
   an electrical connecting device including an insulating planar support member having an upper surface; and
   a plurality of rigid electrically conducting pins each having a pointed end and projecting from the upper surface of the insulating planar support member;
   an insulating package having a lower surface and containing a plurality of electrical circuits; and
   a plurality of bumped malleable contact points connected to the electrical circuits and formed on the lower surface of the insulating package such that when the rigid pins are pressed against the respective bumped contact points, the pointed ends of the rigid pins enter into the respective bumped malleable contact points.

20. The assembly according to claim 19 further comprising a retainer pressing the rigid pins against the respective bumped contact points.

21. The assembly according to claim 19 further comprising an insulating cover layer extending over the bumped contact points, the cover layer being sufficiently soft to be penetrated by pressure applied against the rigid pins.

22. A method of providing electrical connection between an electrical component having a plurality of malleable contact points and a circuit board having a plurality of holes thereon, the method comprising the steps of:

- inserting into each hole a rigid conducting pin having a pointed end such that the pointed end of each pin projects above the board;

- placing the electrical component with the plurality of malleable contact points over the rigid pins such that each contact point contacts the pointed end of the respective rigid pin; and

- pressing the malleable contact points against the respective contact pins such that the pointed ends of the contact pins enter into the respective malleable contact points.

\* \* \* \* \*